(12) United States Patent
Muller et al.

(10) Patent No.: US 9,007,138 B2
(45) Date of Patent: Apr. 14, 2015

(54) OSCILLATOR WITH STARTUP CIRCUITRY

(71) Applicants: Gilles J. Muller, Austin, TX (US);
Jeffrey C. Cunningham, Austin, TX (US); Karthik Ramanan, Austin, TX (US)

(72) Inventors: Gilles J. Muller, Austin, TX (US);
Jeffrey C. Cunningham, Austin, TX (US); Karthik Ramanan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 35 days.

(21) Appl. No.: 13/907,068

(22) Filed: May 31, 2013

(65) Prior Publication Data
US 2014/0354364 A1 Dec. 4, 2014

(51) Int. Cl.
*H03B 5/06* (2006.01)
*H03K 3/0231* (2006.01)
*H03L 1/02* (2006.01)
*H03L 5/00* (2006.01)
*H03L 7/06* (2006.01)

(52) U.S. Cl.
CPC .. *H03L 7/06* (2013.01); *H03L 5/00* (2013.01); *H03K 3/0231* (2013.01); *H03B 2200/0094* (2013.01); *H03L 1/02* (2013.01); *H03B 5/06* (2013.01)

(58) Field of Classification Search
CPC ............. H03B 5/06; H03B 5/30; H03B 5/32; H03B 5/36; H03B 5/366; H03B 2200/0094; H03K 3/0231; H03K 3/0315; H03L 5/00; H03L 7/0995; H03L 1/02

USPC ...... 327/142; 331/57, 116 FE, 116 M, 116 R, 331/154, 158, 160, 172, 173, 182, 183, 185, 331/186, 176; 375/369
See application file for complete search history.

(56) References Cited

U.S. PATENT DOCUMENTS

| | | | |
|---|---|---|---|
| 4,161,773 A | | 7/1979 | Szpakowski |
| 4,307,354 A | * | 12/1981 | Miyagawa et al. ...... 331/116 FE |
| 4,321,562 A | * | 3/1982 | Igarashi ................... 331/116 FE |
| 4,328,571 A | | 5/1982 | Noble |
| 4,387,350 A | * | 6/1983 | Bessolo et al. .......... 331/116 FE |
| 4,591,807 A | | 5/1986 | Davis |
| 4,641,109 A | * | 2/1987 | Hiroshi ................... 331/116 FE |
| 4,818,953 A | | 4/1989 | Feldstein |
| 4,871,982 A | | 10/1989 | Williams et al. |
| 4,956,618 A | | 9/1990 | Ulmer |
| 5,034,624 A | | 7/1991 | Flaherty et al. |
| 5,041,802 A | | 8/1991 | Wei et al. |
| 5,070,311 A | * | 12/1991 | Nicolai ......................... 331/111 |

(Continued)

FOREIGN PATENT DOCUMENTS

CN 102006057 A 4/2011
EP 0828347 A2 11/1998

OTHER PUBLICATIONS

Rusznyak, A., "Start-Up Time of CMOS Oscillators", IEEE Transactions on Circuits and Systems, vol. 34, Issue No. 3, Mar. 1987, pp. 259-268.

*Primary Examiner* — Levi Gannon
(74) *Attorney, Agent, or Firm* — Joanna G. Chiu; David G. Dolezal

(57) ABSTRACT

An oscillator that includes a first source current leg and first sink current leg to source current and sink current, respectively, during a startup mode of oscillator operation. The oscillator includes a second source current leg and a second sink current leg to source current and sink current, respectively, during a second mode of oscillator operation.

18 Claims, 2 Drawing Sheets

(56) References Cited

U.S. PATENT DOCUMENTS

| | | |
|---|---|---|
| 5,534,826 A | 7/1996 | Logan |
| 5,570,067 A | 10/1996 | Shacter |
| 5,594,391 A * | 1/1997 | Yoshizawa ............ 331/57 |
| 5,805,027 A | 9/1998 | Yin |
| 5,844,448 A | 12/1998 | Jackoski et al. |
| 5,909,152 A * | 6/1999 | Li et al. ............ 331/116 FE |
| 6,011,445 A | 1/2000 | Nikhade et al. |
| 6,057,742 A | 5/2000 | Prado |
| 6,172,575 B1 * | 1/2001 | Shinmori ............ 331/116 FE |
| 6,278,336 B1 | 8/2001 | Tinsley et al. |
| 6,304,467 B1 | 10/2001 | Nebrigic |
| 6,329,884 B1 * | 12/2001 | Tsukagoshi et al. .... 331/116 FE |
| 6,411,169 B1 * | 6/2002 | Yabe et al. ............ 331/116 FE |
| 6,445,258 B1 | 9/2002 | Truong |
| 6,640,311 B1 | 10/2003 | Knowles |
| 6,657,501 B1 | 12/2003 | Anil et al. |
| 6,759,914 B2 | 7/2004 | Rusznyak |
| 6,803,833 B2 | 10/2004 | Yen et al. |
| 6,903,616 B2 | 6/2005 | Yin et al. |
| 7,009,458 B2 | 3/2006 | Gazit |
| 7,030,709 B2 * | 4/2006 | Novac ............ 331/158 |
| 7,332,979 B2 | 2/2008 | Connell et al. |
| 7,482,888 B1 | 1/2009 | Kleveland |
| 7,639,097 B2 | 12/2009 | Tran |
| 7,876,144 B2 | 1/2011 | Hashimoto et al. |
| 8,040,195 B2 | 10/2011 | Murata |
| 8,115,562 B2 | 2/2012 | Igarashi |
| 8,120,439 B2 | 2/2012 | Shrivastava et al. |
| 8,358,175 B2 | 1/2013 | Mahooti et al. |
| 8,558,624 B2 * | 10/2013 | Raita ............ 331/47 |
| 8,803,621 B2 * | 8/2014 | Suzuki ............ 331/116 FE |
| 2010/0176892 A1 | 7/2010 | Thompson et al. |
| 2011/0241791 A1 | 10/2011 | Hung |

* cited by examiner

OSCILLATOR WITH STARTUP CIRCUITRY

BACKGROUND

1. Field

This disclosure relates generally to oscillators, and more specifically, to an oscillator with startup circuitry.

2. Related Art

Various types of oscillators are commonly used to provide a clock signal for use within integrated circuits. In some applications, it is important for the oscillator to have a low Process Voltage Temperature (PVT) variation such that a reliable clock signal is provided across PVT variations. Furthermore, upon startup of an oscillator, time is required before a stable clock signal of the oscillator is achieved. For some applications, in which a clock signal is needed quickly upon startup, this stabilization time is too lengthy. For example, in the case of a non-volatile memory (NVM) array which is operating in a very low power (VLP) scheme, the memory wakeup and read operation needs to happen during a relatively short time period. Therefore, waiting for the clock signal to stabilize may prevent achieving the lower target memory access times during VLP. Therefore, a need exists for an improved oscillator with reduced startup times.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, an oscillator provides a startup path to control a circuit node of the oscillator during a startup mode and provides a current controlled path to control the circuit node after the startup mode, once a current reference for the current controlled path has stabilized. During startup, the current reference has not yet stabilized. Therefore, the startup path is enabled and the current control path is disabled. The startup path does not rely on the current reference and instead introduces a resistor-capacitor (RC) time constant to control the circuit node. This produces a clock that is sufficiently stable to provide timing information during startup. Once startup is complete and the current reference is stable, the startup path is disabled and the current controlled path is enabled in which the current controlled path relies on the stable current reference to control the circuit node and provide a stable clock. In this manner, a sufficiently stable clock signal may be provided during startup. Although this clock signal may be less stable than the stable clock signal provided by the current control path, the clock signal during startup is sufficiently stable to provide some reliable timing information, which may be used, for example, to begin wakeup sequences of other circuitry.

Figure 1:
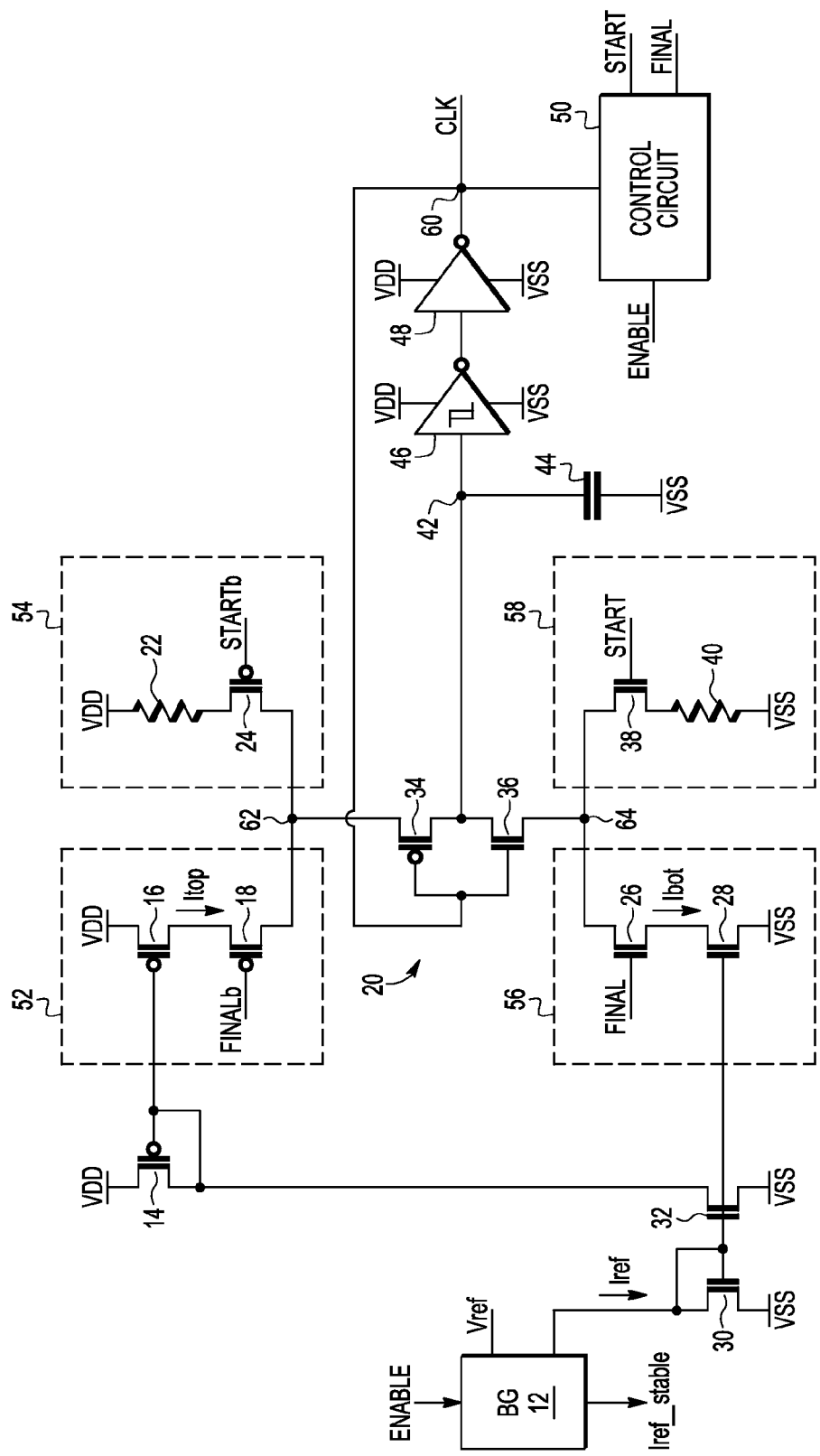
FIG. 1 illustrates, in partial schematic and partial block diagram form, an oscillator circuit in accordance with one embodiment.

FIG. 1 illustrates, in partial block diagram and partial schematic form, an oscillator circuit 10 in accordance with one embodiment. Oscillator circuit 10 includes a band gap circuit (BG) 12, a source current leg 52, a source current leg 54, a sink current leg 56, and a sink current leg 58, an inverter circuit 20, a capacitor 44, resistors 22 and 40, a Schmitt trigger 46, an inverter 48, a control circuit 50, p-type transistors 14, 16, 18, 24, and 34, and n-type transistors 36, 30, 32, 28, 26, and 38. Control circuit 50 receives an enable signal and provides a start signal and a final signal. BG 12 provides a band gap voltage reference (Vref), which may be 1.2V. BG 12 also provides a band gap reference current (Iref), which may be 5 micro amps. Since Vref and Iref are provided by a band gap circuit, they are temperature independent values. Oscillator 10 includes a first power supply node which receives a first power supply, Vdd, and a second power supply node which receives a second power supply, Vss, in which Vdd is greater than Vss. In one embodiment Vdd may refer to the operating voltage of oscillator circuit 10 and Vss may refer to ground. A first current electrode of transistor 30 is coupled to receive Iref from BG 12 and a second current electrode of transistor 30 is coupled to the second power supply node. A control electrode of transistor 30 is coupled to the first current electrode of transistor 30 and a control electrode of transistor 32. A first current electrode of transistor 14 is coupled to the first power supply node, and a second current electrode of transistor 14 is coupled to a first current electrode of transistor 32. A control electrode of transistor 14 is coupled to a second current electrode of transistor 14. A second current electrode of transistor 32 is coupled to the second power supply node. A first current electrode of transistor 16 is coupled to the first power supply node, a control electrode of transistor 16 is coupled to the control electrode of transistor 14, and a second current electrode is coupled to a first current electrode of transistor 18. A control electrode of transistor 18 is coupled to receive an complement of the final signal, finalb. A second current electrode of transistor 18 is coupled to a circuit node 62 (also referred to as a source current node or source node). A first terminal of resistor 22 is coupled to the first power supply node, and a second terminal of resistor 22 is coupled to a first current electrode of transistor 24. A control electrode of transistor 24 is coupled to receive a complement of the start signal, startb. A second current electrode of transistor 24 is coupled to circuit node 62. A first current electrode of transistor 34 is coupled to circuit node 62 and a second current electrode of transistor 34 is coupled to a circuit node 42. A first current electrode of transistor 36 is coupled to circuit node 42, a control electrode of transistor 36 is coupled to a control electrode of transistor 34, and a second current electrode of transistor 36 is coupled to a circuit node 64 (also referred to as a sink current node or sink node). A first current electrode of transistor 26 coupled to circuit node 64, and a control node coupled to receive the final signal. A first current electrode of transistor 28 is coupled to the second current electrode of transistor 26, a control electrode of transistor 28 is coupled to a control electrode of transistor 30, and a second current electrode of transistor 28 is coupled to the second power supply node. A first current electrode of transistor 38 is coupled to circuit node 64, a control electrode of transistor 38 is coupled to receive the start signal, and a second control electrode of transistor 38 is coupled to a first terminal of resistor 40. A second terminal of resistor 40 is coupled to the second power supply node. A first terminal of capacitor 44 is coupled to circuit node 42, and a second terminal of capacitor 44 is coupled to the second power supply node. Schmitt trigger 46 is coupled between the first and second power supply nodes, and has an input coupled to circuit node 42. Inverter 48 is coupled between the first and second power supply nodes and has an input coupled to an output of Schmitt trigger 46. An output of inverter 48 is coupled to a circuit node 60. Circuit node 60 provides the output clock, CLK, of oscillator circuit 10. Also, control circuit 50 and control electrodes of transistors 34 and 36 are coupled to circuit node 60.

Current source leg 52 includes transistors 16 and 18, and current source leg 54 includes resistor 22 and transistor 24. Current sink leg 56 includes transistors 26 and 28, and current sink leg 58 includes transistor 38 and resistor 40. Note that current source leg 52 and current sink leg 56 are part of the current controlled path, and current source leg 54 and current sink leg 58 are part of the startup path. Inverter circuit 20 includes transistors 34 and 36.

In operation, in response to asserting the enable signal, BG 12 and oscillator circuit 10 enter a startup mode in which the start signal is asserted and the final signal is negated. For example, control circuit 50, in response to assertion of the enable signal, asserts the start signal and negates the final signal. Also, as will be discussed below, control circuit 50 may include a counter which is started in response to assertion of the enable signal. During startup, Iref output by BG 12 is not yet stable; therefore, during startup mode, the Iref output of BG 12 is disabled so that the current through transistor 30 is zero. Also, during startup mode, transistors 18 and 26 are turned off by the finalb and final signals and transistors 24 and 38 are turned on by the startb and start signals. Therefore, legs 54 and 58 of the startup path are enabled during startup, but legs 52 and 56 of the current controlled path are disabled during startup. Initially, the value of node 42 is a logic level low, causing the output of Schmitt trigger 46 to be a logic level high, and CLK at the output of inverter 48 (at node 60) begins at a logic level low. With CLK being a logic level low at node 60, transistors 34 is on and transistor 36 is off. With resistors 22 and 40 present and legs 54 and 58 enabled, current flows from VDD through resistor 22, transistor 24, node 62, and transistor 34 to provide current to node 42. That is, leg 54 sources current to source node 62 which is provided to node 42. Therefore, as can be seen in reference to FIG. 2, when the start signal is asserted to enable legs 54 and 58, current is provided to node 42 which charges capacitor 44 and causes the voltage at node 42 to increase until hitting the upper trip point of Schmitt trigger 46. Once the trip point is reached, the output of Schmitt trigger 46 transitions from a logic level high to a logic level low and remains there due to the hysteresis the Schmitt trigger provides. Therefore, the output of inverter 48 goes high resulting in a rising edge of CLK at node 60.

Since node 60 is now a logic level high, transistor 34 is turned off and transistor 36 is turned on. Therefore, with leg 58 is enabled, current is provided from node 42 down through transistor 36, node 64, and transistor 38 through resistor 40 to VSS. That is, leg 58 sinks current from sink node 62, and thus from node 42. Therefore, capacitor 44 is discharged, reducing the voltage at node 42 until the lower trip point of Schmitt trigger 46 is reached causing the output of Schmitt trigger 46 to transition from a logic level low back to a logic level high. Again, the output of Schmitt trigger 46 remains at a logic level high due to the hysteresis. The output of inverter 48 goes low, resulting in a falling edge of CLK at node 60. This type of operation continues so as to produce a CLK signal at node 60 during startup. Therefore, as can be seen in reference to FIG. 2, node 42 is charged by leg 54 until an upper trip point of Schmitt trigger 46 is reached, resulting in a rising edge of CLK, and then node 42 is discharged by leg 58 until a lower trip point of Schmitt trigger 46 is reached, resulting in a falling edge of CLK. The frequency of CLK during startup is therefore dependant on a rate of charge and discharge of capacitor 44. Note that resistors 22 and 40, with capacitor 44, introduce an RC time constant to allow for a CLK signal to be available during startup. Furthermore, the CLK signal provides a stable clock with a steady frequency. In this manner, CLK at node 60 provides a clock signal which is sufficiently stable for use by other circuit portions, even though Iref is not yet stable. As will be discussed below, once Iref is stable, oscillator circuit 10 provides a stable CLK signal with the desired frequency. Note that CLK at node 60 during startup may therefore have a slower frequency and be more affected by temperature and voltage than the resulting CLK at node 60 after the startup period is completed.

Figure 2:
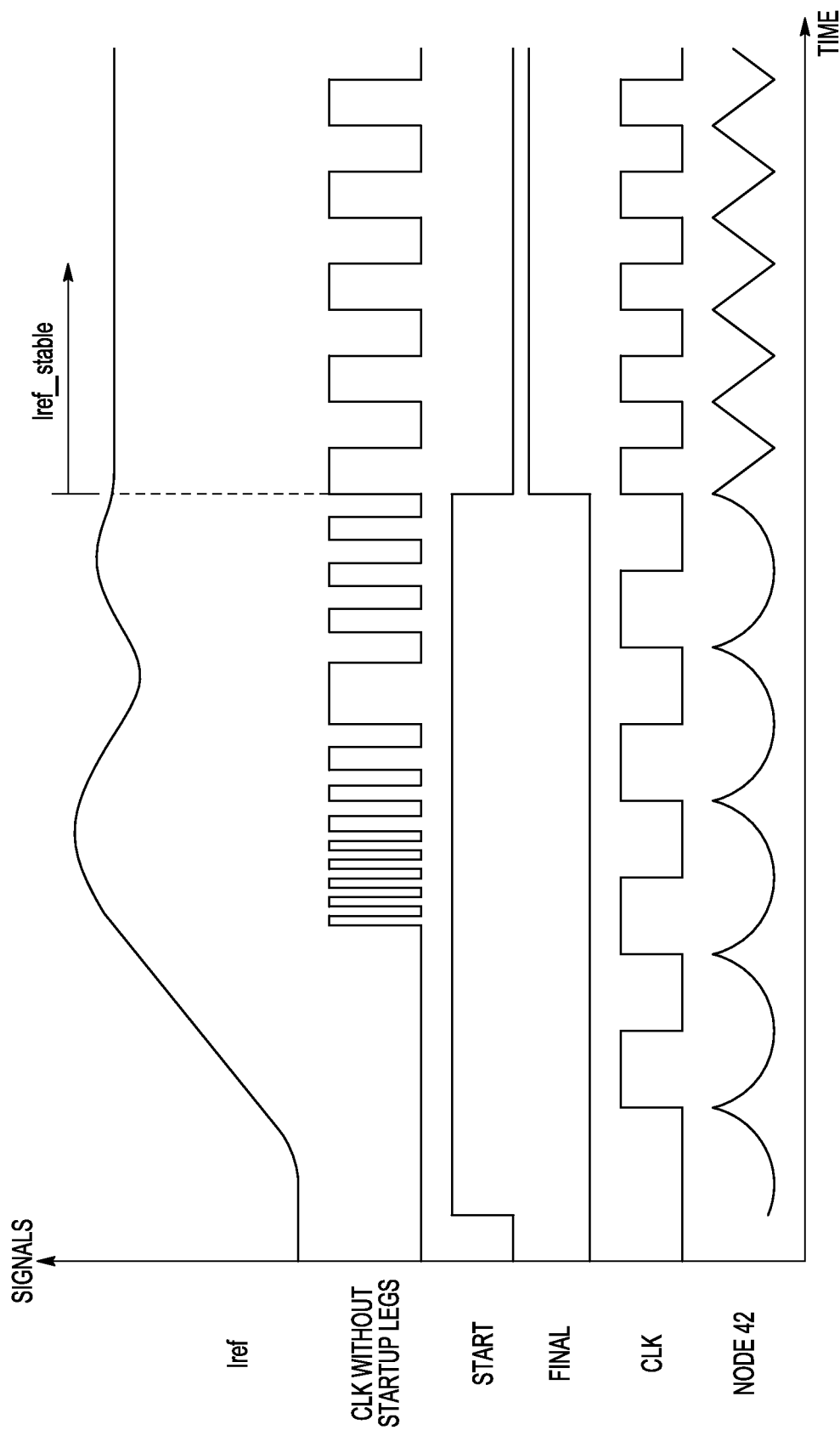
FIG. 2 illustrates, in timing diagram form, operation of the oscillator circuit of FIG. 1 in accordance with an example operation of the oscillator circuit.

Referring to FIG. 2, operation of a CLK signal at node 60 assuming that legs 54 and 58 are not present results in a CLK at node 60 which is not stable or steady. Due to the overshoots and undershoots of the circuit caused by the instability of Iref, CLK may have a very high frequency and/or too much variation. This CLK signal is therefore unable to provide any timing information which may be used to initiate other operations with the circuit. Therefore, any startup operations, such as for performing a read access, are delayed until Iref is stable. However, with legs 54 and 58, the CLK provided at node 60 allows for some operations, such as startup operations, to commence even prior to stabilization of Iref.

Referring back to FIG. 1, once Iref has stabilized, the start signal is negated and the final signal is asserted. In response, legs 54 and 58 are disabled and legs 52 and 56 are enabled. As described above, control circuit 50 may include a counter circuit which is started in response to assertion of the enable signal. This counter circuit may count pulses of CLK at node 60, and after a predetermined number of pulses, control circuit 50 negates the start signal and asserts the final signal. Therefore, in one embodiment, the predetermined number of pulses to be counted is set to a value which corresponds to the time needed for Iref to stabilize, i.e. to the duration of the startup mode. This value may be determined by simulations or testing done during design of the circuit. Alternatively, the value may be determined in other ways. In this embodiment, since control circuit 50 counts pulses of CLK at output node 60 to control the negation of the start signal and assertion of the final signal, steady transitions between startup mode and normal mode subsequent to the startup mode occur.

In alternate embodiments, any type of counter circuit or timing circuit may be used to indicate the duration of the startup mode and when to negate the start signal and assert the final signal. In yet another embodiment, control circuit 50 may not include a counter or timer at all. In this case, BG 12 may provide an Iref_stable indicator to control circuit 50 which is asserted when Iref is stable. Therefore, BG 12 may include circuitry which identifies when Iref is stable and asserts Iref_stable accordingly. In response to assertion of Iref_stable, control circuit 50 may negate start and assert final.

After the startup mode, Iref is stable and thus enabled to be provided from BG 12 to the first current electrode of transistor 30. Note that the control electrodes of transistors 16 and 28 each receive a corresponding bias signal which controls the amount of current provided to source node 62 or the amount of current sinked by node 64. In the illustrated embodiment, transistors 30 and 32 operate as a current mirror, transistors 14 and 16 operate as a current mirror, and transistors 32 and 28 operate as a current mirror. In this embodiment, the bias signals provided to the control electrodes of transistors 16 and 28 are generated using Iref. When transistor 34 is on and transistor 36 is off, Iref, or a current proportional to Iref, appears as Itop provided to the first current electrode of transistor 18. In the case in which transistors 30, 32, 14, and 16 are sized the same, Itop would be the same as Iref. However, transistor 16 can be sized such that Itop is not the same as Iref but proportional to Iref. For example, in one embodiment, transistor 16 can be implemented with a plurality of parallel transistors which may be selectively enabled to determine the value of Itop. The current Itop flows through transistor 18 and node 62 to node 42. Therefore, leg 52 sources current to node 62, which is provided to node 42, thus charging capacitor 44 and increasing the voltage at node 42 until the upper trip point of Schmitt trigger 46 is reached. As described above, when the upper trip point is reached, Schmitt trigger 46 transitions to a logic level low and remains low due to the hysteresis. The output of inverter 48 goes high, thus providing a rising edge of CLK at node 60.

When node 60 is a high, transistor 34 is turned off and transistor 36 is turned on. Therefore, since transistors 32 and 28 operate as a current mirror, Iref, or a current proportional to Iref appears as Ibot provided to the first current electrode of transistor 28. In the case in which transistors 30, 32, and 28 are sized the same, Ibot would be the same as Iref. However, transistor 28 can be sized such that Ibot is not the same as Iref but proportional to Iref. For example, in one embodiment, transistor 28 can be implemented with a plurality of parallel transistors which may be selectively enabled to determined the value of Ibot. With transistor 36 on, leg 56 sinks current from node 64 and thus from node 42 which discharges capacitor 44 and decreases the voltage at node 42 until the lower trip point of Schmitt trigger 46 is reached. At this point, Schmitt trigger 46 transitions to a logic level high and remains high due to the hysteresis. The output of inverter 48 goes low, thus providing a falling edge of CLK at node 60.

Therefore, note that with legs 52 and 56 enabled, after the startup in which Iref has stabilized, oscillator 10 operates as a current controlled relaxation oscillator, in which current sources are used to provide Itop and Ibot. In this manner, oscillator 10 minimally varies with temperature and voltage. Since legs 54 and 58 vary more with temperature and voltage as compared to legs 52 and 56, oscillator circuit 10 varies more with temperature and voltage during startup than after startup. However, even though there is more variation during startup, a sufficiently stable CLK is still provided for use during this time.

Referring back to FIG. 2, due to the current sources enabled with legs 52 and 56 once Iref is stable, note that the rising and falling slopes of node 42 between trip points of Schmitt trigger 46 are linear, as opposed to the charging and discharging of node 42 due to the RC time constant introduced during startup. In one embodiment, transistors 16 and 28 are sized such that Itop and Ibot, after startup, have the same magnitude such that the rising and falling slopes are even, resulting in CLK having a 50% duty cycle. However, in alternate embodiments, the magnitudes of Itop and Ibot, though proportional to Iref, may not be equal, resulting in different rising and falling slopes of node 42. In this case, the duty cycle of CLK would no longer be 50%. Also, both during startup and after startup, a frequency of CLK is dependent upon a frequency of the signal at node 42, as can be seen in FIG. 2, and the frequency of node 42 is dependent on an amount of current sourced to node 62 and an amount of current sinked from node 64.

In the illustrated embodiment of FIG. 1, Schmitt trigger 46 provides a comparison of node 42 with upper and lower trip points to provide an output with hysteresis. However, in alternate embodiments, other circuitry may be implemented to perform the comparisons and provide the hysteresis other than using a Schmitt trigger. Furthermore, additional elements may be provided in the stage between nodes 42 and 60, depending on the type of circuits which receive CLK. Note also that although BG 12 may also output a reference voltage, only the current reference, Iref, may be used.

Therefore, by now it should be understood how an RC time constant can be introduced to an oscillator circuit during startup such that a CLK sufficiently steady clock signal can be provided during startup. That is, by enabling legs which introduce an RC time constant to control a node of the oscillator circuit, operations which require a steady clock may not have to be delayed until a stable reference current, such as Iref, is available. This may allow, for example, for reduced read access times of a memory during VLP.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) or a lower case "b" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different types of comparison circuitries with hysteresis can be used instead of a Schmitt trigger. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes an oscillator circuit including a clock output to provide an output clock signal; a first circuit including: an output node to provide an output signal, a frequency of the output clock signal is dependent upon a frequency of the output signal, a source current node for receiving a source current, a sink current node for providing a sink current; a first source current leg coupled to source current, when enabled, to the source current node; a first sink current leg coupled to sink current, when enabled, from the sink current node; a second source current leg coupled to source current, when enabled, to the source current node; a second sink current leg coupled to sink current, when enabled, from the sink current node; wherein the frequency of the output node is dependent on amount of source current sourced to the source current node and an amount of sink current sinked from the sink current node; a control circuit to control an enablement of the first source current leg, the first sink current leg, the second source current leg, and the second sink current leg, wherein the first source current leg and the first sink current leg are enabled during a startup mode of the oscillator circuit and the second source current leg and the second sink current leg are enabled subsequent to the startup mode of the oscillator circuit. Item 2 includes the circuit of item 1, wherein the first source current leg includes a first resistor, the first source current leg sources current to the source current node through the first resistor; the first sink current leg includes a second resistor, the first sink current leg sinks current from the sink current node through the second resistor. Item 3 includes the circuit of item 1, wherein the second source current leg includes a first transistor, the second source current leg sources current to the source current node through the first transistor, a biasing of the first transistor is controlled by a first bias signal provided to a control terminal of the first transistor, the first bias signal controls an amount of current provided by the second source current leg to the source current node; wherein the second sink current leg includes a second transistor, the second sink current leg sinks current from the sink current node through the second transistor, a biasing of the second transistor is controlled by a second bias signal provided to a control terminal of the second transistor, the second bias signal controls an amount of current sinked by the second source current leg from the sink current node. Item 4 includes the circuit of item 3 and further includes a reference current circuit, the first bias signal and the second bias signal are generated using a reference current generated by the reference current circuit. Item 5 includes the circuit of item 4 wherein the reference current circuit provides a stable signal to indicate whether the reference current is in a stable state; wherein during a startup mode, the control circuit enables the second source current leg and the second sink current leg in response to the stable signal indicating that the reference current has transitioned to a stable state. Item 6 includes the circuit of item 5, wherein during a startup mode, the control circuit disables the first source current leg and the first sink current leg in response to the stable signal indicating that the reference current has transitioned to a stable state. Item 7 includes the circuit of item 4 wherein the reference current circuit is characterized as a band gap circuit. Item 8 includes the circuit of item 1 wherein the control circuit includes a counter coupled to count clock pulses produced by the oscillator circuit, wherein during a start up mode, the control circuit enables the second source current leg and the second sink current leg in response to the counter counting a predetermined number of pulses. Item 9 includes the circuit of item 8 wherein during a startup mode, the control circuit disables the first source current leg and the first sink current leg in response to the counter counting a predetermined number of pulses. Item 10 includes the circuit of item 1 and further includes a capacitor having a first terminal connected to the output node, the output node charging and discharging the capacitor at a frequency of the output signal. Item 11 includes the circuit of item 1 wherein the first circuit includes a first transistor of a first conductivity type and a second transistor of a second conductivity type opposite the first conductivity type, a first current terminal of the first transistor is connected to the source current node, a second current terminal of the first transistor is connected to a first current terminal of the second transistor and to the output node, the second current terminal of the second transistor is connected to the sink current node, a control terminal of the first transistor and a control terminal of the second transistor are each connected to the input node. Item 12 includes the circuit of item 11 wherein the output is connected to an input node of the first circuit, wherein the input node controls whether current is being sourced to or sinked from the output node of the first circuit. Item 13 includes the circuit of item 1 wherein current sourced to the source current node by the first source current leg varies more with temperature and voltage than current sourced to the source current node by the second source current leg; current sinked from the sink current node by the first sink current leg varies more with temperature and voltage than current sinked from the sink current node by the second sink current leg.

Item 14 includes a method of starting an oscillator circuit including: providing a clock signal at an output of the oscillator circuit during a first mode, wherein the providing a clock signal during the first mode includes alternatingly sourcing current to a first node of the oscillator circuit using a first source current leg and sinking current from the first node using a first sink current leg; after the first mode, providing a clock signal at the output of the oscillator circuit during a second mode, wherein the providing a clock signal during the second mode includes alternatingly sourcing current to a first node of the oscillator circuit using a second source current leg and sinking current from the first node using a second sink current leg; wherein source current is not sourced to the first node from the second source current leg and sink current is not sinked from the first node by the second sink current leg during the first mode; wherein source current is not sourced to the first node from the first source current leg and sink current is not sinked from the first node by the first sink current leg during the second mode. Item 15 includes the method of item 14, wherein the oscillator circuit transitions from the first mode to the second mode based on an output of the oscillator circuit producing a predetermined number of clock pulses. Item 16 includes the method of item 14 wherein current sourced to the first node by the first source current leg varies more with temperature and voltage than current sourced to the first node by the second source current leg; current sinked from the first node by the first sink current leg varies more with temperature and voltage than current sinked from the first node by the second sink current leg. Item 17 includes the method of item 14, and further includes providing a reference current by a reference circuit; wherein the providing a clock signal at the output of the oscillator circuit during a second mode includes using the reference current to control an amount of current sourced to the first node by the second current source leg and to control an amount of current sinked from the first node by the second current sink leg. Item 18 includes the method of item 17 wherein the oscillator circuit transitions from the first mode to the second mode based on an indication that the reference current is stable. Item 19 includes the method of item 14 wherein the first node is connected to a capacitor, wherein sourcing current to the first node charges the capacitor and sinking current from the first node discharges the capacitor, wherein a frequency of the clock signal is dependent on a rate of charge and discharge of capacitor.

Item 29 includes an oscillator circuit including: a clock output to provide an output clock signal; a capacitor, a frequency of the output clock signal is dependent on a rate of charge and discharge of the capacitor; a first source current leg coupled to source current, when enabled, to charge the capacitor during a startup mode of operation; a first sink current leg coupled to sink current, when enabled, to discharge the capacitor during the startup mode of operation; a second source current leg coupled to source current, when enabled, to charge the capacitor during a second mode of operation after the startup mode of operation; a second sink current leg coupled to sink current, when enabled, to discharge the capacitor during the second mode; wherein current sourced by the first source current leg varies more with temperature and voltage than current sourced by the second source current leg; wherein current sinked by the first sink current leg varies more with temperature and voltage than current sinked by the second sink current leg.

What is claimed is:

1. An oscillator circuit comprising:
a clock output to provide an output clock signal;
a first circuit comprising:
   an output node to provide an output signal, a frequency of the output clock signal is dependent upon a frequency of the output signal;
   a source current node for receiving a source current;
   a sink current node for providing a sink current;
   a first source current leg coupled to source current, when enabled, to the source current node;
   a first sink current leg coupled to sink current, when enabled, from the sink current node;
   a second source current leg coupled to source current, when enabled, to the source current node;
   a second sink current leg coupled to sink current, when enabled, from the sink current node;
   wherein the frequency of the output node is dependent on amount of source current sourced to the source current node and an amount of sink current sinked from the sink current node;
a control circuit to control an enablement of the first source current leg, the first sink current leg, the second source current leg, and the second sink current leg, wherein the first source current leg and the first sink current leg are enabled during a startup mode of the oscillator circuit and the second source current leg and the second sink current leg are enabled subsequent to the startup mode of the oscillator circuit,
wherein current sourced to the source current node by the first source current leg varies more with temperature and voltage than current sourced to the source current node by the second source current leg, and current sinked from the sink current node by the first sink current leg varies more with temperature and voltage than current sinked from the sink current node by the second sink current leg.

2. The circuit of claim 1 wherein:
the first source current leg includes a first resistor, the first source current leg sources current to the source current node through the first resistor;
the first sink current leg includes a second resistor, the first sink current leg sinks current from the sink current node through the second resistor.

3. The circuit of claim 1 wherein:
the second source current leg includes a first transistor, the second source current leg sources current to the source current node through the first transistor, a biasing of the first transistor is controlled by a first bias signal provided to a control terminal of the first transistor, the first bias signal controls an amount of current provided by the second source current leg to the source current node;
wherein the second sink current leg includes a second transistor, the second sink current leg sinks current from the sink current node through the second transistor, a biasing of the second transistor is controlled by a second bias signal provided to a control terminal of the second transistor, the second bias signal controls an amount of current sinked by the second source current leg from the sink current node.

4. The circuit of claim 3 further comprising:
a reference current circuit, the first bias signal and the second bias signal are generated using a reference current generated by the reference current circuit.

5. The circuit of claim 1 wherein the control circuit includes a counter coupled to count clock pulses produced by the oscillator circuit, wherein during a start up mode, the control circuit enables the second source current leg and the second sink current leg in response to the counter counting a predetermined number of pulses.

6. The circuit of claim 5 wherein during a startup mode, the control circuit disables the first source current leg and the first sink current leg in response to the counter counting a predetermined number of pulses.

7. The circuit of claim 1 further comprising a capacitor having a first terminal connected to the output node, the output node charging and discharging the capacitor at a frequency of the output signal.

8. The circuit of claim 1 wherein the first circuit includes a first transistor of a first conductivity type and a second transistor of a second conductivity type opposite the first conductivity type, a first current terminal of the first transistor is connected to the source current node, a second current terminal of the first transistor is connected to a first current terminal of the second transistor and to the output node, the second current terminal of the second transistor is connected to the sink current node, a control terminal of the first transistor and a control terminal of the second transistor are each connected to the input node.

9. The circuit of claim 8 wherein the output is connected to an input node of the first circuit, wherein the input node controls whether current is being sourced to or sinked from the output node of the first circuit.

10. An oscillator circuit comprising:
a clock output to provide an output clock signal;
a first circuit comprising:
   an output node to provide an output signal, a frequency of the output clock signal is dependent upon a frequency of the output signal;

a source current node for receiving a source current;
a sink current node for providing a sink current;
a first source current leg coupled to source current, when enabled, to the source current node;
a first sink current leg coupled to sink current, when enabled, from the sink current node;
a second source current leg coupled to source current, when enabled, to the source current node;
a second sink current leg coupled to sink current, when enabled, from the sink current node;
wherein the frequency of the output node is dependent on amount of source current sourced to the source current node and an amount of sink current sinked from the sink current node;
a control circuit to control an enablement of the first source current leg, the first sink current leg, the second source current leg, and the second sink current leg, wherein the first source current leg and the first sink current leg are enabled during a startup mode of the oscillator circuit and the second source current leg and the second sink current leg are enabled subsequent to the startup mode of the oscillator circuit;
wherein the first source current leg includes a first resistor, the first source current leg sources current to the source current node through the first resistor, and the first sink current leg includes a second resistor, the first sink current leg sinks current from the sink current node through the second resistor;
wherein the second source current leg includes a first transistor, the second source current leg sources current to the source current node through the first transistor, a biasing of the first transistor is controlled by a first bias signal provided to a control terminal of the first transistor, the first bias signal controls an amount of current provided by the second source current leg to the source current node;
wherein the second sink current leg includes a second transistor, the second sink current leg sinks current from the sink current node through the second transistor, a biasing of the second transistor is controlled by a second bias signal provided to a control terminal of the second transistor, the second bias signal controls an amount of current sinked by the second source current leg from the sink current node;
a reference current circuit, the first bias signal and the second bias signal are generated using a reference current generated by the reference current circuit, wherein the reference current circuit provides a stable signal to indicate whether the reference current is in a stable state; and
wherein during a startup mode, the control circuit enables the second source current leg and the second sink current leg in response to the stable signal indicating that the reference current has transitioned to a stable state.

11. The circuit of claim 10 wherein during a startup mode, the control circuit disables the first source current leg and the first sink current leg in response to the stable signal indicating that the reference current has transitioned to a stable state.

12. An oscillator circuit comprising:
a clock output to provide an output clock signal;
a first circuit comprising:
an output node to provide an output signal, a frequency of the output clock signal is dependent upon a frequency of the output signal;
a source current node for receiving a source current;
a sink current node for providing a sink current;
a first source current leg coupled to source current, when enabled, to the source current node;
a first sink current leg coupled to sink current, when enabled, from the sink current node;
a second source current leg coupled to source current, when enabled, to the source current node;
a second sink current leg coupled to sink current, when enabled, from the sink current node;
wherein the frequency of the output node is dependent on amount of source current sourced to the source current node and an amount of sink current sinked from the sink current node;
a control circuit to control an enablement of the first source current leg, the first sink current leg, the second source current leg, and the second sink current leg, wherein the first source current leg and the first sink current leg are enabled during a startup mode of the oscillator circuit and the second source current leg and the second sink current leg are enabled subsequent to the startup mode of the oscillator circuit;
wherein the first source current leg includes a first resistor, the first source current leg sources current to the source current node through the first resistor, and the first sink current leg includes a second resistor, the first sink current leg sinks current from the sink current node through the second resistor;
wherein the second source current leg includes a first transistor, the second source current leg sources current to the source current node through the first transistor, a biasing of the first transistor is controlled by a first bias signal provided to a control terminal of the first transistor, the first bias signal controls an amount of current provided by the second source current leg to the source current node;
wherein the second sink current leg includes a second transistor, the second sink current leg sinks current from the sink current node through the second transistor, a biasing of the second transistor is controlled by a second bias signal provided to a control terminal of the second transistor, the second bias signal controls an amount of current sinked by the second source current leg from the sink current node;
a reference current circuit, the first bias signal and the second bias signal are generated using a reference current generated by the reference current circuit, wherein the reference current circuit is characterized as a band gap circuit.

13. A method of starting an oscillator circuit comprising:
providing a clock signal at an output of the oscillator circuit during a first mode, wherein the providing a clock signal during the first mode includes alternatingly sourcing current to a first node of the oscillator circuit using a first source current leg and sinking current from the first node using a first sink current leg;
after the first mode, providing a clock signal at the output of the oscillator circuit during a second mode, wherein the providing a clock signal during the second mode includes alternatingly sourcing current to the first node of the oscillator circuit using a second source current leg and sinking current from the first node using a second sink current leg;
wherein source current is not sourced to the first node from the second source current leg and sink current is not sinked from the first node by the second sink current leg during the first mode;

wherein source current is not sourced to the first node from the first source current leg and sink current is not sinked from the first node by the first sink current leg during the second mode;

wherein current sourced to the first node by the first source current leg varies more with temperature and voltage than current sourced to the first node by the second source current leg; and wherein current sinked from the first node by the first sink current leg varies more with temperature and voltage than current sinked from the first node by the second sink current leg.

14. The method of claim 13, wherein the oscillator circuit transitions from the first mode to the second mode based on an output of the oscillator circuit producing a predetermined number of clock pulses.

15. The method of claim 13 further comprising:
providing a reference current by a reference circuit;
wherein the providing a clock signal at the output of the oscillator circuit during a second mode includes using the reference current to control an amount of current sourced to the first node by the second current source leg and to control an amount of current sinked from the first node by the second current sink leg.

16. The method of claim 13 wherein the first node is connected to a capacitor, wherein sourcing current to the first node charges the capacitor and sinking current from the first node discharges the capacitor, wherein a frequency of the clock signal is dependent on a rate of charge and discharge of capacitor.

17. A method of starting an oscillator circuit comprising:
providing a clock signal at an output of the oscillator circuit during a first mode, wherein the providing a clock signal during the first mode includes alternatingly sourcing current to a first node of the oscillator circuit using a first source current leg and sinking current from the first node using a first sink current leg;
after the first mode, providing a clock signal at the output of the oscillator circuit during a second mode, wherein the providing a clock signal during the second mode includes alternatingly sourcing current to the first node of the oscillator circuit using a second source current leg and sinking current from the first node using a second sink current leg, wherein source current is not sourced to the first node from the second source current leg and sink current is not sinked from the first node by the second sink current leg during the first mode, wherein source current is not sourced to the first node from the first source current leg and sink current is not sinked from the first node by the first sink current leg during the second mode;
providing a reference current by a reference circuit, wherein the providing a clock signal at the output of the oscillator circuit during a second mode includes using the reference current to control an amount of current sourced to the first node by the second current source leg and to control an amount of current sinked from the first node by the second current sink leg, wherein the oscillator circuit transitions from the first mode to the second mode based on an indication that the reference current is stable.

18. An oscillator circuit comprising:
a clock output to provide an output clock signal;
a capacitor, a frequency of the output clock signal is dependent on a rate of charge and discharge of the capacitor;
a first source current leg coupled to source current, when enabled, to charge the capacitor during a startup mode of operation;
a first sink current leg coupled to sink current, when enabled, to discharge the capacitor during the startup mode of operation;
a second source current leg coupled to source current, when enabled, to charge the capacitor during a second mode of operation after the startup mode of operation;
a second sink current leg coupled to sink current, when enabled, to discharge the capacitor during the second mode;
wherein current sourced by the first source current leg varies more with temperature and voltage than current sourced by the second source current leg;
wherein current sinked by the first sink current leg varies more with temperature and voltage than current sinked by the second sink current leg.

* * * * *